United States Patent
Liu (10) Patent No.: US 6,884,458 B2
(45) Date of Patent: Apr. 26, 2005

(54) SENSOR FOR MONITORING MATERIAL DEPOSITION AND METHOD OF MONITORING MATERIAL DEPOSITION

(75) Inventor: Chang Liu, Champaign, IL (US)

(73) Assignee: The Board of Trustees of The University of Illinois, Urbana, IL (US)

( * ) Notice: Subject to any disclaimer, the term of this patent is extended or adjusted under 35 U.S.C. 154(b) by 0 days.

(21) Appl. No.: 10/309,774

(22) Filed: Dec. 4, 2002

(65) Prior Publication Data

US 2004/0109938 A1 Jun. 10, 2004

(51) Int. Cl.[7] .............................................. C23C 16/52
(52) U.S. Cl. ........................... 427/9; 427/10; 427/248.1
(58) Field of Search ........................... 427/9, 10, 248.1; 118/666, 712

(56) References Cited

U.S. PATENT DOCUMENTS 5,536,317 A * 7/1996 Crain et al. .................. 118/664

FOREIGN PATENT DOCUMENTS

| JP | 09218064 A | * | 8/1997 | ............ G01F/1/68 |
| JP | 2000065617 A | * | 3/2000 | ............ G01F/1/68 |

OTHER PUBLICATIONS

Wongso Sutomo, Xuefeng Wang, David Bullen, Sarah K. Braden, Chang Liu, "Development of An End–Point Detector for Parylene Deposition Process", Proceedings of 16th IEEE International Micro Electro Mechanical Systems Conference, MEMS 2003, Kyoto, Japan, Jan. 19–23, 2003, pp. 1–17.

M.R. Douglass, "Lifetime Estimates and Unique Failure Mechanisms of the Digital Micromirror Device (DMD)", *Proceedings of Reliability Physics Symposium (IRPS)*, Reno, California 1998, pp. 9–16.

Michael A. Mignardi, "From ICs to DMD's", TI Technical Journal, DLP–DMD Manufacturing and Design Challenges, Jul.–Sep. 1998, pp. 56–63.

"Portable Vacuum Deposition Systems", Speedline Technologies Speciality Coating Systems website—Parylene Deposition Systems, date unknown, pp. 1–2.

"Specialty Coating Systems—Parylene Applications" Speedline Technologies, website, date unknown, p. 1.

"MEMS (Microelectromechanical System)", Speedline Technologies, Specialty Coating Systems website—Parylene Applications, date unknown, pp. 1–2.

"Specialty Coating Systems—About Us" website, Speedline Technologies, 2002, p. 1.

"The Expanding Market for Microdisplays. (Market Watch)", Solid State Technology, pp. 32(1)–(4), Dec. 2001.

"Projectors Poised As Focal Point of Networked Home", Electronic Engineering Times, pp. 32 (1)–(3), Mar. 26, 2001.

Parylene Coating Services, "*Properties of Parylene*", http://www.paryleneinc.com/techinfo.html, retrieved from the Internet Dec. 24, 2001.

(Continued)

*Primary Examiner*—Timothy Meeks
(74) *Attorney, Agent, or Firm*—Greer, Burns & Crain, Ltd.

(57) ABSTRACT

A material deposition sensor includes a heater and a temperature sensor separated from one another. In operation, the sensor is disposed within a deposition chamber, and material is deposited onto the sensor. When a particular material thickness is deposited, a direct thermally conductive path is created between the heater and temperature sensor, and heat from the heater conducts directly to the temperature sensor. By predetermining a deposition thickness necessary to create the direct thermally conductive path, the deposition thickness can be controlled and/or predicted.

18 Claims, 7 Drawing Sheets

OTHER PUBLICATIONS

T.A. Harder, T. Yao, Q. He, C. Shih and Y.C. Tai, "*Residual Stress in Thin Film Parylene–C*", 15$^{th}$ Int. Conf. On Micro Electro Mechanical Systems, MEMS '02, pp. 435–438, Las Vegas, NE, 2002.

P.F. Man, D.K. Jones and C.H. Mastrangelo, "*Microfluidic Plastic Capillaries on Silicon Substrates: A New Inexpensive Technology for Bioanalysis Chips,*" 10$^{th}$ Int. Worshop Micro Electro Mechanical Systems, MEMS '97, pp. 311–316, Nagoya, Japan, 1997.

H–S. Noh, P.J. Hesketh and G.C. Frye–Mason, "*Heating Element Embedded Parylene Microcolumn for Miniature Gas Chromatograph,*" Proc., 15$^{th}$ Int. Conf. Micro Electro Mechanical Systems, MEMS '02, pp. 73–76, Las Vegas, NE, 2002.

X.Q. Wang, A. Desai, Y.C. Tai, L. Licklider and T.D. Lee, "*Polymer–Based Electrospray Chips for Mass Spectrometry,*" Proc. 12$^{th}$ Int. Conf. Micro Electro Mechanical Systems, pp. 523–528, Orlando, FL, 1999.

X.Q. Wang, Q. Lin and Y.C. Tai, "*A Parylene Micro Check Valve,*" Proc. 12$^{th}$ Int. Conf. Micro Electro Mechanical Systems, pp. 177–182, Orlando, FL, 1999.

W.H. Chu, M. Mehregany, and R.L. Mullen, "*Analysis of Tip Deflection and Force of a Bimetallic Cantilever Microactuator,*" J. Micromechanics and Microengineering, vol. 3, pp. 4–7, 1993.

\* cited by examiner

SENSOR FOR MONITORING MATERIAL DEPOSITION AND METHOD OF MONITORING MATERIAL DEPOSITION

FIELD OF THE INVENTION

The present invention relates generally to processes and equipment for deposition of materials.

BACKGROUND OF THE INVENTION

Deposition of materials is used for purposes such as microfabrication, substrate treatment, coating, or others. For example, Parylene (poly-para-xylylene) is a family of organic, dielectric, polymer materials that may be deposited by chemical vapor deposition (CVD) methods under room temperature, or slightly above or below room temperature. It is an exceptionally conformal coating material with very low pin-hole density. Parylene is particularly useful for sealing or insulating, and can be used for fabricating and/or treating devices such as semiconductor, telecommunication, micromachining, and micro-electromechanical (MEMS) devices. It is also useful for purposes such as document preservation.

In fabrication or treating processes involving deposition of Parylene or other materials, it is often important to monitor the deposition thickness to control the thickness. For example, a Parylene film may be employed to function as part of a mechanical structure, such as a sensor or an actuator. In this case, the thickness of the film is an important parameter in determining the performance specifications of the structure.

Typically, Parylene deposition thickness is determined by preloading a deposition system with a controlled amount of solid-phase dimer materials. The thickness is controlled either by the amount (weight, for example) of polymer dimer that is loaded into a vacuum sublimation chamber, where Parylene deposition is typically conducted, or by the time of the deposition process. Many industrial processes use the former control method. When an amount of dimer is used to predict or control the deposition thickness, the endpoint of the process is determined by the moment the preloaded dimer is exhausted; that is, at the complete sublimation of all of the dimer materials.

However, these conventional methods do not reliably predict or control the actual deposition thickness. There can be a significant run-to-run variance of deposition thickness for a certain deposition time or pre-loaded dimer amount, for example, due to changing baffle geometry from prior deposition. Variation on the order of 10–40% has been commonly observed. In addition, for large deposition chambers (often used in industry), the thickness may also vary from location to location with a significant overall variance, typically between 5%–10%. This variance may be acceptable for general coating and sealing applications, however it is too great for certain applications, such as many MEMS applications, where materials such as Parylene form integral mechanical components. Inaccuracy of predicting and/or controlling deposition thickness is especially problematic when the planned deposition thickness is relatively small, for example, less than 5 $\mu$m.

SUMMARY OF THE INVENTION

The present invention provides a method and apparatus for in situ monitoring of material deposition within a vacuum chamber. In a method according to the invention, a sensor is provided. The sensor, including a heater and a temperature sensor, is disposed within the chamber. The heater and temperature sensor are separated from one another. As material is deposited, the heater is actuated, the response of the temperature sensor is measured, and detection of the existence of a direct thermally conductive path between the heater and temperature sensor is made.

DETAILED DESCRIPTION OF THE INVENTION

The present invention provides, among other things, an apparatus and method for in situ monitoring of deposition of a material onto an object within a deposition chamber, such as a vacuum chamber. The object is located within the deposition chamber; for example, suspended by a support or resting on a bottom surface of the chamber. The invention also provides a method of detecting an endpoint when a selected thickness of the material has been deposited. An in situ endpoint sensor is based on thermal transfer principles, and includes a substrate having a heater and a temperature sensor separated from one another, preferably by a gap or gaps having a well-defined distance. The heater and temperature sensor preferably are disposed at or near facing distal ends of first and second cantilever beams.

In a preferred method of operation, the sensor is disposed within the chamber, and the material is deposited in a conformal fashion over the sensor. A prescribed electrical current is supplied to the heater, preferably in short pulses, and the temperature sensor is interrogated simultaneously. Before the gap or gaps become closed by the deposited material, the heat due to the actuated heater travels exclusively in an indirect conductive path, such as through the two cantilever beams and the supporting substrate, to reach the temperature sensor. This indirect heat transfer path is denoted Path 1. When the material deposition thickness reaches an amount necessary to close the gap, the heat from the heater is conducted directly through the gap or gaps, as well as through Path 1. For example, for a single gap of predetermined distance d, a material thickness of d/2, assuming even deposition, will complete the direct thermally conductive path. The heat transfer path directly across the gap or gaps, once closed, is denoted Path 2. The heat transfer process associated with Path 2 is much faster than that of Path 1, and also creates a higher temperature reading by the temperature sensor. This results in an identifiable thermal signature that can be used to determine when the direct path is created, and thus when the desired material thickness (for example, d/2) has been deposited. Because thickness of deposition material necessary to complete the thermally conductive path is predetermined, detection of the completed path results in detection of deposition of the predetermined thickness. The sensor preferably allows precise, in situ monitoring of material deposition, and allows the deposition process to be stopped once a selected deposition thickness is reached, even if the preloaded dimer material has not yet been exhausted. The method and apparatus may be used to monitor deposition of materials that can be deposited at or slightly above or below room temperature and that have a conformal deposition profile, for example, Parylene.

One or more sensors having multiple pairs of heaters and temperature sensors may be disposed within the chamber to monitor deposition of multiple thicknesses and/or to estimate a deposition rate in situ. This estimated deposition rate allows deposition of a predetermined amount of material.

Figure 1:
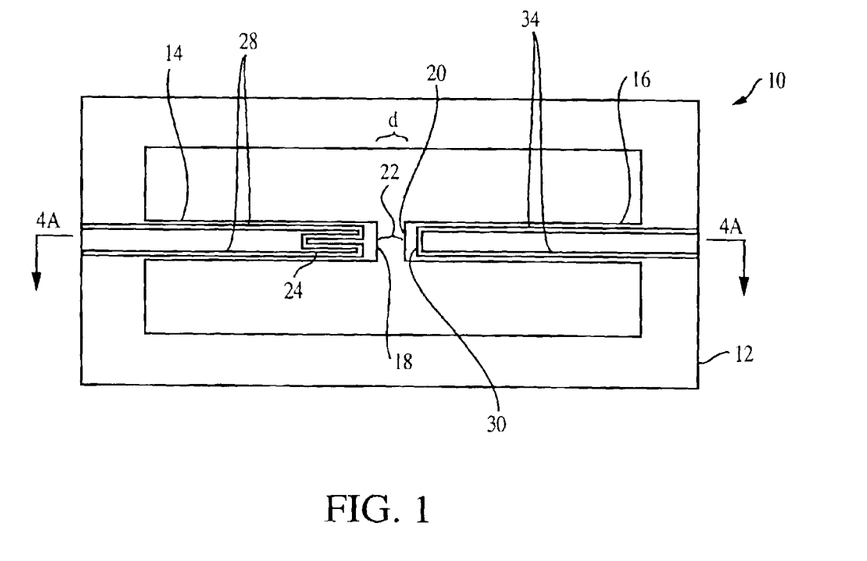
FIG. 1 is a schematic top view of a sensor according to one embodiment of the present invention.

Referring now to the drawings, FIG. 1 shows an embodiment of a material deposition sensor 10 according to a preferred aspect of the present invention. The sensor 10 includes a substrate 12 that supports a first cantilever beam 14 and a second cantilever beam 16. The substrate 12 and the first and second cantilever beams 14, 16 are preferably fabricated from silicon, though other materials may be used. Preferably, the first and second cantilever beams 14, 16 are thin and narrow beams of a diving-board type. The first and second cantilever beams 14, 16 are positioned on the substrate 12 so that first and second distal ends 18, 20, respectively, of the first and second cantilever beams face one another, and are separated by a well-defined gap 22 of distance d.

A heater 24 is disposed on the first cantilever beam 14, preferably at or near the first distal end 18. The heater 24 is preferably a heater resistor made of a patterned thin film metal (such as gold). Alternatively, the heater resistor has other configurations and/or is made of other metals, such as aluminum, copper, or platinum, as nonlimiting examples, or alternatively made of doped silicon or polycrystalline silicon. In an alternative embodiment, the heater 24 is not a resistor, but instead provides heat through local irradiation by shining or receiving a well-focused laser beam. Generally, a "heater" as used herein is any element or device that can be configured to actively or passively emit heat. In a preferred embodiment, the heater 24 is configured to generate ohmic heating when an electrical current is passed through it, preferably via a conductive path, for example a first pair of wire leads 28, that may also be disposed on the first cantilever beam 14.

A temperature sensor 30 is formed on the second cantilever beam 16, preferably at or near the second distal end 20, for sensing a temperature affected by the heater 24. The temperature sensor 30 preferably is a thermal resistor formed by selective doping of the second cantilever beam 16 with boron or phosphorus atoms, as nonlimiting examples. The temperature sensor 30 may alternatively be a thermistor made using a thin film metal whose resistance changes with its temperature. Nonlimiting examples for a thin film thermistor are Pt and Ni. Other configurations for temperature sensors are contemplated, such as a thermocouple. The temperature sensor 30 connects to an ohmmeter 32 (see FIG. 2) or other element for receiving signals, preferably via a conductive path, such as a second pair of wire leads 34, that may be disposed on the second cantilever beam 16.

In a preferred embodiment, the sensor 10 is fabricated using microfabrication technologies such as optical lithography and micromachining. Optical lithography and micromachining allow the first and second cantilever beams 14, 16 to be relatively long, narrow and thin, thereby increasing thermal resistances by reducing heat transfer from the heater 24 to the substrate 12. This increases a time constant associated with indirect (through the remaining substrate) heat transfer, and facilitates detection of direct (not through the substrate) conductive heat transfer from the heater 24 to the temperature sensor 30. It also reduces unnecessary heat loss and power consumption. The substrate 12 may also be thermally insulated to further reduce heat transfer to the substrate. Furthermore, optical lithography permits more precise deposition monitoring by allowing precise definition of the distance d of the gap 22. Though it is preferred that the gap 22 is defined between the distal ends 18, 20, it will be appreciated that the gap can be disposed at various locations depending on the particular configuration of the sensor 10.

Figure 3:
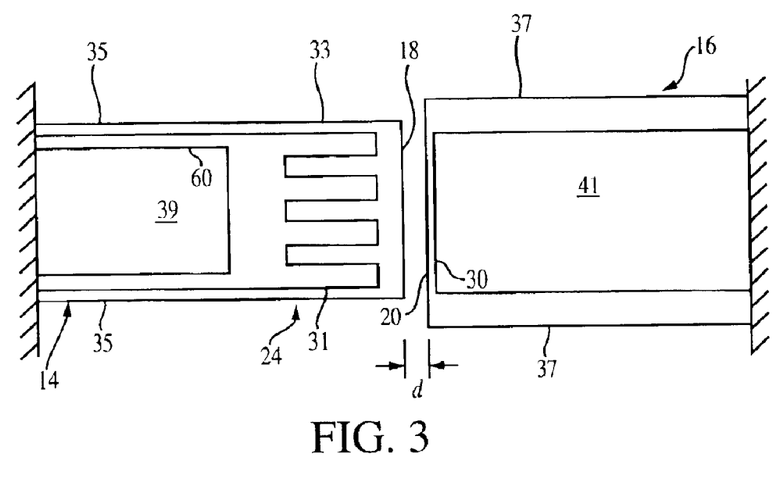
FIG. 3 is a schematic of a preferred embodiment heater and temperature sensor.

FIG. 3 shows a preferred embodiment heater and temperature sensor. The heater 24 of FIG. 3 is a heater coil 31 positioned on a heater coil plate 33 near the distal end 18 of the first cantilever beam 14 (shown partially in FIG. 3), and the temperature sensor 30 is a doped silicon resistor disposed at the distal end 20 (and forming the second distal end) of the second cantilever beam 16 (shown in part). Both the heater 24 and the temperature sensor 30 are supported in cantilever fashion by pairs of opposing, relatively thin silicon beams 35, 37. The beams 35, 37, along with the heater 24 and the temperature sensor 30, define openings 39, 41 within each of the first and second cantilever beams 14, 16. This increases the thermal resistance of the indirect heat transfer path.

Instead of arranging the first and second cantilever beams 14, 16 to face one another with a substantially 180° angle between them, it is contemplated that other arrangements for the cantilever beams are possible. For example, the beams 14, 16 may be arranged at a relative angle that is less than or greater than 90°, or arranged in parallel to one another. Typically, the gap 22 is configured to be a precisely defined opening that can be filled with a deposition material to create a more direct thermally conductive path between the heater 24 and the temperature sensor 30 than is possible before the gap is filled. For directly facing cantilever beams, the gap 22 is defined between the distal ends 18, 20, though this position of the gap is not required for all embodiments. The sensor 10 can be designed to precisely define the gap to have a length of d for a desired deposition thickness of d/2. In an alternative embodiment, the first and second cantilever beams 14, 16 are formed on different substrates. However, it is preferred that the cantilever beams 14, 16 be formed on a monolithic substrate, such as the substrate 12, to maximize the precision of the distance d of the gap 22.

In yet another alternative embodiment, a gap includes a conductor disposed within the gap, preferably bisecting the gap and creating first and second equally-sized smaller gaps between the conductor and both the heater 24 and the temperature sensor 30, respectively. When the material is deposited on the sensor, both smaller gaps are filled and approach the conductor. Preferably both smaller gaps are closed substantially simultaneously to complete a direct thermal path. For an overall gap distance d with an interposed conductor of width c, for example, a deposition thickness of d–c/2, assuming even deposition, will have occurred when a direct thermal path is created. Thus, a thickness of the conductor may be chosen to create a desired endpoint deposition thickness for a sensor.

In a preferred method of fabricating the sensor 10, thin thermal oxide is grown as an insulating layer on a preferably <100>-oriented silicon wafer. Single-crystal silicon is a preferred material for the first and second cantilever beams 14, 16 because it has very little intrinsic material stress, and thus the first and second cantilever beams exhibit little intrinsic bending. Intrinsic bending is undesirable, as it may distort the size of the gap 22. When the temperature of the sensor is raised during a heat pulse as a result of current applied to the heater 24, or by the current used to interrogate the temperature sensor 30, the first and second cantilever beams 14, 16 may bend due to bimetallic bending. The fundamental cause of the bimetallic bending is a difference of thermal expansion coefficient between the heater 24 and the material of the first and second cantilever beams 14, 16.

Space distortion may also result if the thickness of the first and second cantilever beams 14, 16 is too low (typically less than 8 $\mu$m). In the preferred embodiment shown in FIG. 3, the thickness of the cantilevers is approximately 40 $\mu$m. At this preferred thickness, both intrinsic bending (at room temperature) and thermal bimetallic bending (when the temperature is raised above the room temperature) are negligible. It will be appreciated, however, that the thickness may vary.

The temperature sensor 30 is formed on the silicon wafer preferably using selective doping. In this case, the thermal oxide layer can serve as a doping mask. Alternatively, a temperature sensor can be formed by thin film metal resistors, whose resistance values are a function of their temperature (so-called thermal resistance effect). In a preferred method of forming the heater 24, thin film metal (such as 200-nm-thick gold) is evaporated and patterned to form a heater resistor.

To pattern the silicon substrate 12, bulk etching is performed from the backside of the wafer using either deep reactive ion etching (DRIE) or anisotropic silicon etching. The wafer is etched to a predetermined depth. Thickness of the substrate 12 is controlled by timed etching. Next, ion etching is performed from the front side to define the first and second cantilever beams 14, 16. The mask layout precisely defines the distance d of the gap 22, as the distance d is used to determine or predict the deposition thickness reliably. The heater 24 and the temperature sensor 30 are located at or near the facing first and second distal ends 18, 20 of the first and second cantilever beams 14, 16.

Figure 2:
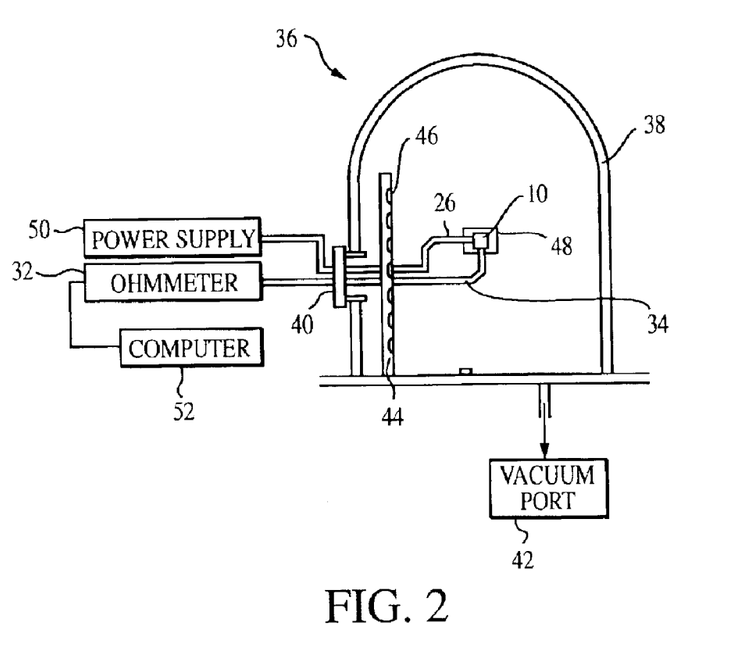
FIG. 2 is a schematic of a material deposition system including a sensor according to an aspect of the present invention.

FIG. 2 shows a vacuum deposition chamber 36 fitted with the sensor 10 according to an exemplary embodiment of the present invention. In an experiment performed by the present inventors, the chamber 36 was a commercially available PDS 2010 Labcoter® deposition system. The chamber 36 includes a dome 38 that encloses the chamber. The dome 38 is sealed with a seal 40, except for a vacuum port 42. A material release mechanism 44, containing a number of release holes 46, is disposed within the chamber 36 to supply the deposition material. The sensor 10 is disposed within the chamber 36, supported by a rack 48. The first and second conductive paths (the first pair and second pair of wire leads 28, 34) are connected to a power supply 50 and the ohmmeter 32, respectively, which are preferably located outside of the chamber 36. The ohmmeter 32 may be connected to a suitable data acquisition circuit, such as a computer-controlled data acquisition and signal-processing unit 52, for collecting signals provided by the ohmmeter and for analyzing the signals. Any suitable connection may be used, for example an RS232 link. The power supply 50 may also be connected to the unit 52 for controlling the supply of current to the heater 24.

Preferably, the temperature sensor 30 is calibrated before initial use. During calibration, change of resistance is measured as a function of the temperature of the substrate 12 by placing the sensor 10 on top of a temperature-controlled stage. The resistance changes with respect to the stage temperature in a linear fashion.

Figure 4A:
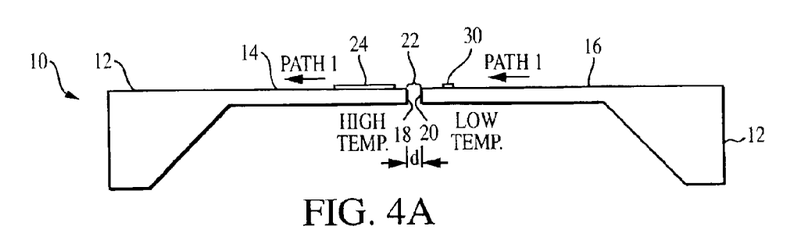
FIGS. 4A–4C are schematic diagrams showing a side view of a sensor according to an embodiment of the present invention, at first, second, and third stages of material deposition, respectively.
Figure 4B:
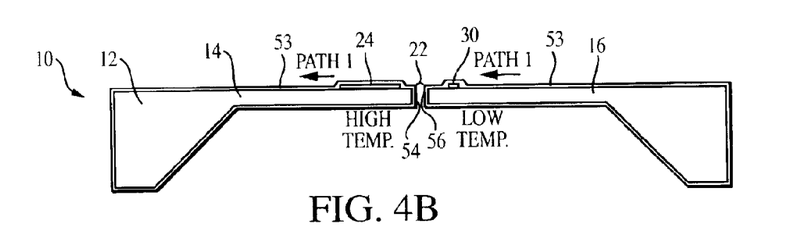
Figure 4C:
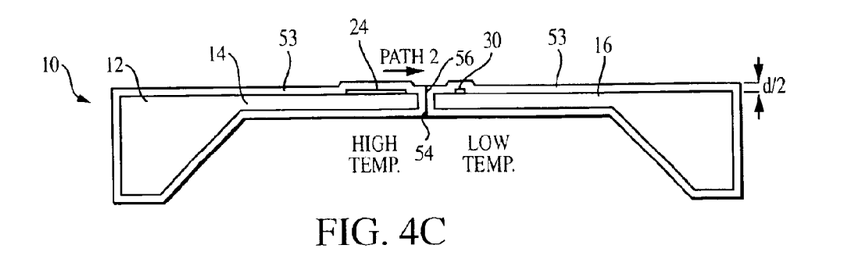

A preferred method of operating the sensor 10 will now be described with reference to FIGS. 4A–4C. Simultaneously to the actuation of the heater 24, the temperature sensor 30 is interrogated to measure the transmitted heat. When a current is supplied to the heater 24, ohmic heating is generated. This heat may be transmitted to the temperature sensor 30 generally by two conductive heat transfer modes. Under a first transfer mode, the heat can travel through the lengths of the first and second cantilever beams 14, 16 and through the substrate 12. This path is denoted Path 1 and shown in FIGS. 4A–4B. Under a second transfer mode, the heat can conduct through the gap 22 (having distance d) between the first and second distal ends 18, 20 of the first and second cantilever beams 14, 16 if a thermally conducting media (such as air or the deposition material) is present within the gap. This path is denoted Path 2 and shown in FIG. 4C. As will be appreciated by those in the art, the first heat transfer mode (Path 1) involves a much longer heat conduction path and greater thermal mass.

The deposition material is deposited in a low-pressure environment within the chamber 36, with a preferred deposition pressure between 20–40 mtorr. Objects that are to be coated with the deposition material are placed in the same chamber. When the sensor 10 is first placed under vacuum within the chamber 36, as shown in FIG. 4A, the thermal conduction through the gap 22 (Path 2) is negligible, and thus the first heat transfer mode (through Path 1) dominates initially. The material 53 forms on the sensor 10 in a conformal fashion, and the distance d of the gap 22 is gradually reduced by first and second fronts 54, 56 of the deposited material, as shown in FIG. 4B. When the thickness of the deposited material 53 reaches d/2 (with even deposition), the first and second fronts 54, 56 meet, as shown in FIG. 4C, thereby filling the gap 22 and completing a direct thermal conduction path (Path 2). As the gap 22 is filled with the deposited material 53, heat can be transmitted under both the first and the second transfer modes. The resultant heat transfer characteristics preferably create an identifiable thermal signature that can be used to determine that the gap 22 has been filled. By predefining the distance d of the gap 22, the sensor 10 detects when a particular thickness (d/2) of the deposited, conforming material 53 is reached.

Preferably, the endpoint of the material deposition process is determined using one of two methods. The first method evaluates the time response of the temperature sensor 30 when heat pulses are applied. The thermal time constants associated with the two transfer modes can be made vastly different by design. Specifically, the time constant associated with the second mode (through Path 2) can be made much shorter (e.g., <0.5 s) compared to that of the first mode (through Path 1, e.g., >100 s). The thermal time is proportional to the mass to be heated and inversely proportional to the thermal capacitance of the mass.

The second method measures the steady-state temperature of the sensor 10 under constant power input to the heater 24.

Under this second method, the spatial difference of temperature is significantly different between a time before the gap 22 is closed and a time after the gap is closed. Specifically, the temperature detected by the temperature sensor 30 increases significantly (preferably >5% at least to overcome noise, most preferably between approximately 10–20%) after the gap is closed, since heat is being transmitted by both the first and the second transfer modes. This temperature difference sensed by the temperature sensor 30 can be detected and determined automatically by the data acquisition unit 52, suitably programmed, or by use of a comparator, for example.

It is preferred that power to the heater 24 is supplied in short pulses, producing a series of heat pulses. A shorter duration between pulses increases accuracy of the sensor to a point, because the sensor 10 does not detect closing of a gap until the next pulse arrives. However, if power is supplied to the heater 24 for a continuous, extended period, or if the duration between pulses is too short, the substrate 12 of the sensor 10 may be heated to a higher temperature. This can significantly lower the thickness of the deposited material 53, and may affect the accuracy of the sensor. Because a period of deposition time may elapse between the actual closing of the gap 22 and its detection using the next sequential pulse and interrogation, a small amount of material may be deposited after the direct thermal path is created and before a subsequent interrogation.

A description follows of an exemplary operation of a preferred method of deposition monitoring performed by the present inventors. Using a Parylene deposition system similar to the chamber 36 shown in FIG. 2, Parylene was deposited within the chamber. The chamber 36 contained a sensor 10 including the gap 22 with a pre-defined distance d of 10 $\mu$m. The resistance of the temperature sensor 30 (a thermistor) was monitored throughout courses of the deposition run by applying square-wave pulses with a constant magnitude (5 Volts) and pulse width (5 seconds). The average interval between pulses was 5 minutes, to reduce heating of the substrate 12 during the monitoring process and reduce disruption of the Parylene deposition. The resistance output of the temperature sensor 30 during the sample run is shown in FIG. 5.

Figure 6:
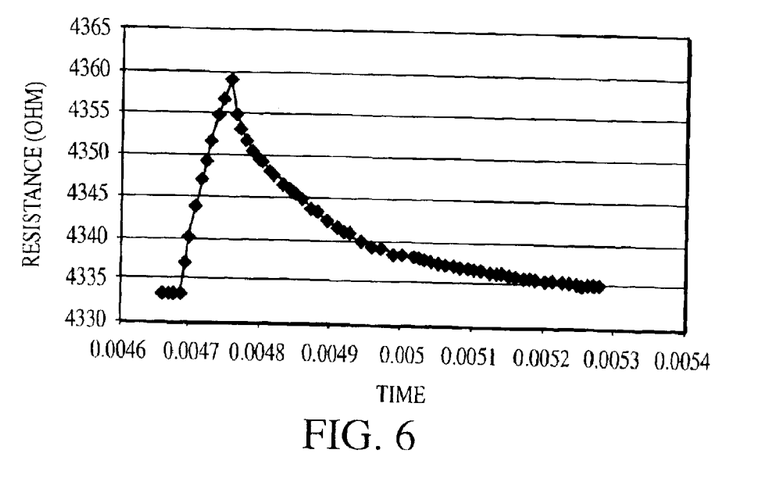
FIG. 6 is a graph showing a rise and fall of resistance of a temperature sensor under a step power output to a heater, before a gap between the temperature sensor and heater is sealed by Parylene.

The sample deposition run lasted 1 hour and 17 minutes. During this run, fifteen power pulses were applied to the heater 24, resulting in fifteen peaks. The first ten peaks correspond to a period during the sample run before the gap 22 was bridged due to the deposited Parylene (i.e., when only the first transfer mode is effective). FIG. 6 shows a typical waveform selected from the first ten peaks. As the power supplied to the heater 24 is suddenly increased, the temperature (and therefore resistance) of the temperature sensor 30 increases exponentially with a measured time constant of approximately hundreds of seconds. After the power is cut off, the resistance value gradually returns to the original level.

Figure 5:
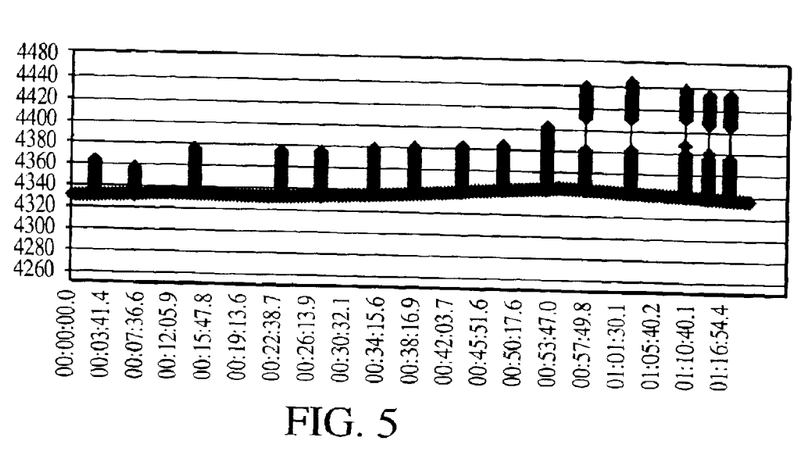
FIG. 5 is a graph showing responses of a temperature sensor to a series of power pulses applied to a heater.
Figure 7:
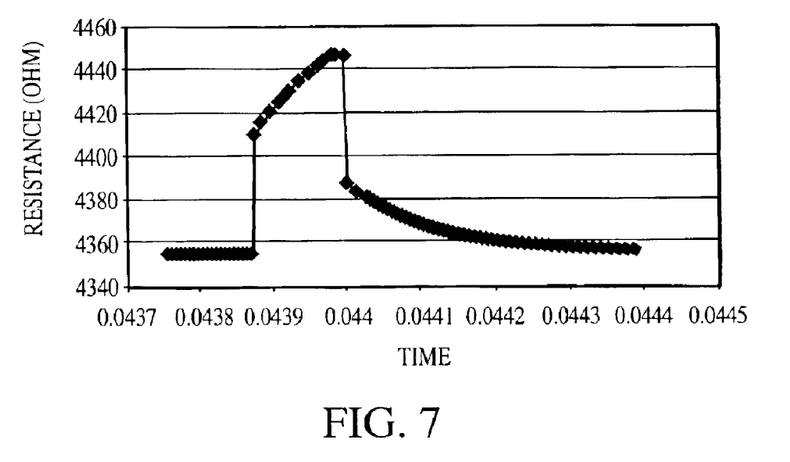
FIG. 7 is a graph showing a rise and fall of resistance of a temperature sensor under a step power output to a heater, after a gap between the temperature sensor and heater is sealed by Parylene.

The last five peaks shown in FIG. 5 correspond to a period after the gap 22 is closed by the deposited Parylene. FIG. 7 shows a representative plot of the last five peaks. As is shown in FIG. 7, the resistance of the temperature sensor 30 changes rapidly upon the application of power via the first pair of wire leads 28. Furthermore, the peak height increases significantly (for example, at least 5%) relative to the first ten peaks, as shown in FIG. 5. This is because the heat pulse, supplied through the first pair of wire leads 28, travels across the gap 22, now bridged by the deposited Parylene, to the temperature sensor 30 directly (i.e., the second transfer mode). The rate of resistance change then slows, indicating that the heating effect from the substrate 12 is dominant. After the supplied power is turned off, it is again seen that the resistance of the temperature sensor 30 decreases rapidly before the heating effect of the substrate 12 catches up.

By determining when the temperature response changes using the measured time response or temperature response, one can determine when the gap 22 has been closed by deposition of d/2 thickness. The deposition process can then be stopped at this point so that substantially only the desired thickness (d/2) is deposited onto the object (not shown) or objects also disposed within the chamber 36.

It is further contemplated under the present invention that a plurality of heaters 24 and temperature sensors 30 of similar or different configuration can be arranged within a single deposition chamber 36 for measuring or estimating various thicknesses or time intervals of material deposition in situ. Gaps 22 between pairs of heaters 24 and temperature sensors 30 can be configured to close sequentially to determine a linear growth rate of deposition and thus predict or control a specific deposition thickness.

Figure 8:
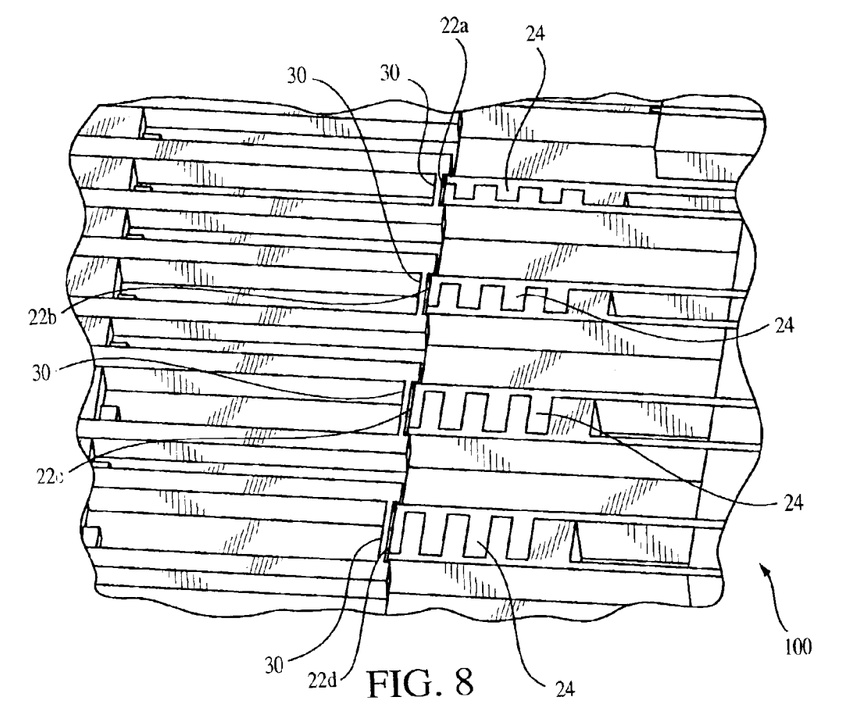
FIG. 8 is a schematic view of part of a sensor having a plurality of pairs of heaters and temperature sensors.

For example, FIG. 8 shows a sensor 100 with an array of heaters 24 and temperature sensors 30. The heaters 24 and temperature sensors 30 are preferably configured similarly to the respective parts shown in FIG. 3. Each of the facing pairs of heaters 24 and temperature sensors 30 are separated by respective gaps 22a, 22b, 22c, 22d having different distances. For example, as shown in the sensor 100 of FIG. 8, the gap distances may increase from top (gap 22a) to bottom (gap 22d). The sensor 100 may be disposed within the chamber 36 to detect the time duration of deposition needed to close each of the sequence of gaps 22a, 22b, 22c, 22d. Again, because a period of deposition time may elapse between the actual closing of the gap 22a, 22b, 22c, 22d and its detection, there may be a slight period of time after a particular gap is closed before a time duration is determined, and thus the detected time when the gap is closed may vary up to the length of a duration between the actual gap closing and the next sequential pulse and interrogation.

By determining the deposition times for closing the prescribed gap distances 22a, 22b, 22c, 22d, it is possible to extract the approximate linear growth rate of the deposition material. This allows prediction of deposition thickness in real time and in situ. It is contemplated that less than all of the gaps 22a, 22b, 22c, 22d may be closed before determining a growth rate, but at least a plurality of gaps is needed. Once a growth rate is determined, deposition thickness can be controlled. It is contemplated that a plurality of individual sensors 10 having varying respective predetermined gap distances may also be used to extract a deposition rate.

Sensors 10, 100 having gaps 22 corresponding to standard desired deposition thicknesses can be produced in a factory, for example, and endpoints for these standard deposition thicknesses can be used for calculating deposition rates, and/or for providing or estimating particular deposition thicknesses in situ, with a relatively low investment in hardware, setup time, and configuration.

From the above description, one skilled in the art will appreciate that a novel apparatus and method has been shown and described for monitoring material deposition. Sensors 10, 100 allow monitoring of deposition thickness and endpoint determination with relatively high precision, before complete sublimation of preloaded deposition material. The sensor 10, 100 preferably can be implemented in material deposition systems, including existing commercial systems, with minimal modification to the systems. The sensor 10, 100 can be fabricated at a relatively low cost, using relatively simple electronics for signal processing, and can be made small enough to avoid interfering with the deposition process, allowing in situ monitoring of material deposition.

While various embodiments of the present invention have been shown and described, it should be understood that other modifications, substitutions, and alternatives are apparent to one of ordinary skill in the art. Such modifications, substitutions, and alternatives can be made without departing from the spirit and scope of the invention, which should be determined from the appended claims.

Various features of the invention are set forth in the appended claims.

What is claimed is:

1. A method of depositing a selected thickness of a deposition material within a vacuum chamber, the method comprising the steps of:

providing a sensor within the chamber, the sensor comprising a heater and a temperature sensor separated from one another;

depositing the deposition material within the chamber and onto the sensor so that the deposition material is deposited between the heater and the temperature sensor;

actuating the heater;

measuring a response of the temperature sensor to said actuating step;

determining that a thermally conductive path is created by deposition of the deposition material based on the measured response, indicating that the selected thickness of the deposition material has been reached;

stopping said depositing based on said determining step;

wherein said depositing occurs at a temperature such that the measured response after the thermally conductive path is created is distinguishable from the measured response before the thermally conductive path is created.

2. The method according to claim 1 wherein the heater is disposed on a first cantilevered beam and the temperature sensor is disposed on a second cantilevered beam disposed in facing relationship to the heater, and wherein a gap is defined between a first distal end of the first cantilevered beam and a second distal end of the second cantilevered beam.

3. The method of claim 2 wherein the gap has a distance d, and wherein said determining step determines that the gap is closed when a thickness of the deposition material deposited in said deposition step is d/2.

4. The method according to claim 1 wherein said actuating step comprises supplying a series of current pulses to the heater to produce a series of heat pulses.

5. The method according to claim 4 wherein said measuring step comprises measuring a response of the temperature sensor to each of the heat pulses.

6. The method according to claim 1 wherein said measuring step further comprises measuring a time response of the temperature sensor under a time-varying heating pulse.

7. The method according to claim 6 wherein said determining step comprises determining whether the temperature sensor responds rapidly to the change of temperature of the heater.

8. The method according to claim 1 wherein the heater and the temperature sensors are disposed on a substrate.

9. A method of detecting an endpoint when a selected thickness of a deposition material is deposited within a vacuum chamber, the method comprising the steps of:

providing a sensor within the chamber, the sensor comprising a heater and a temperature sensor separated from one another;

depositing the material within the chamber and onto the sensor so that the material is deposited between the heater and the temperature sensor;

actuating the heater;

measuring a response of the temperature sensor to said actuating step;

detecting creation of a direct thermal couple caused by deposition of the material based on the measured response, the direct thermal couple being created when the selected thickness of the material is deposited;

wherein said depositing occurs at a temperature such that the measured response after the direct thermal couple is created is distinguishable from the measured response before the direct thermal couple is created.

10. The method according to claim 9 wherein the heater is disposed on a first cantilevered beam and the temperature sensor is disposed on a second cantilevered beam, the first and second cantilevered beams being supported by a substrate and disposed within the chamber in facing relationship to one another, and wherein a gap is defined between a first distal end of the first cantilevered beam and a second distal end of the second cantilevered beam.

11. The method of claim 9 wherein the gap has a distance d, and the selected thickness is d/2.

12. A method according to claim 9 further comprising the steps of:

providing a plurality of pairs of heaters and sensors, each being separated by a gap of different size, within the deposition chamber;

determining an endpoint time of deposition for a plurality of deposition end points specified by the different gap sizes, respectively;

using the determined endpoint times, estimating an actual rate of deposition for the deposition material within the chamber.

13. A method according to claim 12 wherein the plurality of pairs of heaters and sensors are arranged in an array on a substrate.

14. A method according to claim 12 further comprising the step of:

using the estimated actual rate of deposition, depositing a predetermined amount of the deposition material onto an object.

15. A method of determining an endpoint of a process for depositing a selected thickness of a deposition material onto an object within a chamber, the method comprising the steps of:

monitoring heat transfer from a heater to a sensor, the heater and sensor being separated from one another across a gap;

signaling increase of heat transfer caused by creation of a direct thermally conductive path at least partially formed due to deposition of the deposition material;

the depositing of the deposition material occurring at a temperature such that the monitored heat transfer caused by creation of the direct thermally conductive path is distinauishable from the monitored heat transfer before the thermally conductive path is created.

16. A method according to claim 15 wherein said step of monitoring further comprises the step of causing the heater to produce a series of heat pulses.

17. A method according to claim 15 wherein said step of signaling comprises signaling when a time constant of the heat transfer decreases due to closing of a gap due to deposition of the deposition material.

18. A method according to claim 17 wherein said gap has a predetermined thickness d, and wherein the deposition of the deposition material has a thickness on the object of d/2.

* * * * *